(12) United States Patent
Cho et al.

(10) Patent No.: US 8,980,739 B2
(45) Date of Patent: Mar. 17, 2015

(54) SOLDER COLLAPSE FREE BUMPING PROCESS OF SEMICONDUCTOR DEVICE

(75) Inventors: Moon-gi Cho, Suwon-Si (KR);
Sang-hee Lee, Yongin-si (KR);
Jeong-woo Park, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/473,728

(22) Filed: May 17, 2012

(65) Prior Publication Data
US 2012/0295434 A1    Nov. 22, 2012

(30) Foreign Application Priority Data
May 18, 2011    (KR) .................. 10-2011-0046940

(51) Int. Cl.
*H01L 21/44*    (2006.01)
*H01L 23/00*    (2006.01)

(52) U.S. Cl.
CPC .............. *H01L 24/13* (2013.01); *H01L 24/11* (2013.01); *H01L 2224/03* (2013.01); *H01L 2224/0345* (2013.01); *H01L 2224/0401* (2013.01); *H01L 2224/05166* (2013.01); *H01L 2224/05647* (2013.01); *H01L 2224/11462* (2013.01); *H01L 2224/1147* (2013.01); *H01L 2224/1181* (2013.01); *H01L 2224/11849* (2013.01); *H01L 2224/11902* (2013.01); *H01L 2224/13082* (2013.01); *H01L 2224/13111* (2013.01); *H01L 2224/13147* (2013.01); *H01L 2224/03912* (2013.01)
USPC ...................................... 438/614

(58) Field of Classification Search
USPC ........................................................ 438/614
See application file for complete search history.

(56) References Cited

U.S. PATENT DOCUMENTS 3,458,925 A * 8/1969 Napier et al. ................. 438/613
5,937,320 A * 8/1999 Andricacos et al. .......... 438/614
(Continued)

FOREIGN PATENT DOCUMENTS

| JP | 3397313 | 2/2003 |
|---|---|---|
| JP | 3800802 | 5/2006 |
| KR | 1020020060307 | 7/2002 |

OTHER PUBLICATIONS

Lin, Wei "Study of Fluxless Soldering Using Formic Acid Vapor" IEEE Trans. on Adv. Packaging, vol. 22, No. 4, Nov. 1999 pp. 592-601.*

(Continued)

*Primary Examiner* — Yu-hsi D Sun
*Assistant Examiner* — Grant Withers
(74) *Attorney, Agent, or Firm* — Ellsworth IP Group PLLC

(57) ABSTRACT

A method of forming bumps of a semiconductor device with reduced solder bump collapse. The method includes preparing a semiconductor substrate in which pads are exposed externally from a passivation layer; forming a seed layer on the semiconductor substrate; forming a photoresist pattern to expose the seed layer on the pads; forming pillars by performing a primary electroplating on a region exposed by the photoresist pattern; forming a solder layer by performing a secondary electroplating on the pillars; removing the photoresist pattern; forming solder bumps, in which solders partially cover surfaces of the pillars, by performing a reflow process on the semiconductor substrate; and removing portions of the seed layer formed in regions other than the solder bumps.

17 Claims, 5 Drawing Sheets

(56) References Cited

U.S. PATENT DOCUMENTS

| | | | |
|---|---|---|---|
| 6,344,407 B1* | 2/2002 | Matsuki et al. | 438/613 |
| 6,818,545 B2* | 11/2004 | Lee et al. | 438/614 |
| 6,878,465 B2* | 4/2005 | Moon et al. | 428/650 |
| 7,119,002 B2* | 10/2006 | Lin | 438/612 |
| 7,135,770 B2* | 11/2006 | Nishiyama et al. | 257/734 |
| 7,208,834 B2* | 4/2007 | Lee et al. | 257/737 |
| 7,407,824 B2* | 8/2008 | Kerr et al. | 438/22 |
| 7,863,739 B2* | 1/2011 | Lee et al. | 257/737 |
| 7,902,679 B2* | 3/2011 | Lin et al. | 257/778 |
| 7,960,270 B2* | 6/2011 | Lee et al. | 438/612 |
| 7,960,831 B2* | 6/2011 | Hua et al. | 257/738 |
| 7,994,043 B1* | 8/2011 | Mis et al. | 438/612 |
| 8,072,070 B2* | 12/2011 | Lee et al. | 257/737 |
| 8,158,508 B2* | 4/2012 | Lin et al. | 438/614 |
| 8,283,781 B2* | 10/2012 | Wu et al. | 257/738 |
| 8,304,905 B2* | 11/2012 | Matsui et al. | 257/737 |
| 8,334,594 B2* | 12/2012 | Lo et al. | 257/737 |
| 8,368,213 B2* | 2/2013 | Lee et al. | 257/738 |
| 8,435,881 B2* | 5/2013 | Choi et al. | 438/612 |
| 8,461,679 B2* | 6/2013 | Lee et al. | 257/737 |
| RE44,431 E* | 8/2013 | Pendse | 257/734 |
| 2001/0040290 A1* | 11/2001 | Sakurai et al. | 257/737 |
| 2002/0121692 A1* | 9/2002 | Lee et al. | 257/737 |
| 2003/0219926 A1* | 11/2003 | Yuzawa | 438/106 |
| 2008/0050906 A1* | 2/2008 | Lee et al. | 438/614 |
| 2008/0261390 A1* | 10/2008 | Chen et al. | 438/613 |
| 2009/0127708 A1* | 5/2009 | Lee et al. | 257/737 |
| 2009/0140429 A1* | 6/2009 | Lee et al. | 257/751 |
| 2009/0233436 A1* | 9/2009 | Kim et al. | 438/614 |
| 2009/0267213 A1* | 10/2009 | Lin et al. | 257/687 |
| 2011/0003470 A1* | 1/2011 | Burgess et al. | 438/614 |
| 2011/0086505 A1* | 4/2011 | Yu | 438/614 |
| 2011/0186991 A1* | 8/2011 | Lee et al. | 257/737 |
| 2011/0193220 A1* | 8/2011 | Kuo et al. | 257/737 |
| 2011/0193223 A1* | 8/2011 | Ozaki et al. | 257/737 |
| 2011/0212615 A1* | 9/2011 | Huang | 438/614 |
| 2011/0233766 A1* | 9/2011 | Lin et al. | 257/737 |
| 2011/0260317 A1* | 10/2011 | Lu et al. | 257/737 |
| 2012/0007230 A1* | 1/2012 | Hwang et al. | 257/737 |
| 2012/0007231 A1* | 1/2012 | Chang | 257/737 |
| 2012/0009783 A1* | 1/2012 | Lin | 438/666 |
| 2012/0018878 A1* | 1/2012 | Cheng et al. | 257/737 |
| 2012/0040524 A1* | 2/2012 | Kuo et al. | 438/614 |
| 2012/0049367 A1* | 3/2012 | Migita et al. | 257/738 |
| 2012/0068334 A1* | 3/2012 | Migita et al. | 257/737 |
| 2012/0086123 A1* | 4/2012 | Park et al. | 257/737 |
| 2012/0098124 A1* | 4/2012 | Wu et al. | 257/737 |
| 2012/0114872 A1* | 5/2012 | Lu et al. | 427/535 |
| 2012/0129333 A1* | 5/2012 | Yim et al. | 438/613 |
| 2012/0220118 A1* | 8/2012 | Chew et al. | 438/614 |
| 2012/0228763 A1* | 9/2012 | Akiyama et al. | 257/737 |
| 2012/0241949 A1* | 9/2012 | Sasaki et al. | 257/737 |
| 2012/0248605 A1* | 10/2012 | Yamaguchi | 257/738 |
| 2012/0280384 A1* | 11/2012 | Lin et al. | 257/737 |
| 2012/0326297 A1* | 12/2012 | Choi et al. | 257/737 |
| 2013/0012015 A1* | 1/2013 | Oh et al. | 438/614 |
| 2013/0015576 A1* | 1/2013 | Lin | 257/737 |
| 2013/0069231 A1* | 3/2013 | Shen | 257/738 |
| 2013/0075907 A1* | 3/2013 | Pang | 257/741 |
| 2013/0082090 A1* | 4/2013 | Cho et al. | 228/176 |
| 2013/0134581 A1* | 5/2013 | Lin et al. | 257/737 |
| 2013/0175683 A1* | 7/2013 | Hsiao et al. | 257/737 |
| 2013/0181340 A1* | 7/2013 | Uehling et al. | 257/737 |
| 2013/0193564 A1* | 8/2013 | Liu et al. | 257/632 |
| 2013/0196499 A1* | 8/2013 | Burgess et al. | 438/614 |

OTHER PUBLICATIONS

JEDEC Standard Article "JEDEC Standard for Preconditioning of Nonhermetic Surface Mount Devices Prior to Reliability Testing" JEDEC copyright 2008 pp. 1-16.*

* cited by examiner

SOLDER COLLAPSE FREE BUMPING PROCESS OF SEMICONDUCTOR DEVICE

CROSS-REFERENCE TO RELATED APPLICATIONS

This application claims the benefit of Korean Patent Application No. 10-2011-0046940, filed on May 18, 2011, in the Korean Intellectual Property Office, the disclosure of which is incorporated herein in its entirety by reference.

BACKGROUND OF THE INVENTION

1. Field of the Invention

The present inventive concept relates to a method of forming bumps used in a semiconductor device fabricating process, and more particularly, to a method of forming bumps connected to a pad of a semiconductor chip via electroplating.

2. Description of the Related Art

Semiconductor devices having circuit units formed in silicon substrates, such as a DRAM, a flash memory, a system LSI (Large Scale Integration circuit) device, etc., extend the function of an internal circuit to external electronic devices via pads. In the related art, such a pad of a semiconductor device is generally connected to an external printed circuit board (PCB) via wire bonding. However, along with miniaturization of semiconductor devices, increases in processing speeds of semiconductor devices, and increases in the number of input and output signals with respect to semiconductor chips, a structure in which a pad of a semiconductor chip is directly connected to a PCB via a pad formed on the pad is generally employed. Generally, currently known methods of forming bumps on a semiconductor chip include a vacuum deposition method, an electroplating method, a solder jetting method, etc.

SUMMARY OF THE INVENTION

The inventive concept provides a method of forming bumps of a semiconductor device with reduced solder bump collapse in bump forming process in which copper pillars are formed to narrow gaps between the bumps.

Additional features and utilities of the present general inventive concept will be set forth in part in the description which follows and, in part, will be obvious from the description, or may be learned by practice of the general inventive concept.

Exemplary embodiments of the present inventive concept provide a method of forming bumps of a semiconductor device with reduced solder bump collapse, the method including preparing a semiconductor substrate in which pads are exposed to the outside from a passivation layer; forming a seed layer on the semiconductor substrate; forming a photoresist pattern for exposing the seed layer on the pads; forming pillars by performing a primary electroplating on a region exposed by the photoresist pattern; forming a solder layer by performing a secondary electroplating on the pillars; removing the photoresist pattern; forming solder bumps, in which solders partially cover surfaces of the pillars, by performing a reflow process on the semiconductor substrate; and removing portions of the seed layer formed in regions other than the solder bumps.

The method may further include forming a buffer insulation layer for exposing the pads on the semiconductor substrate, where the buffer insulation layer may be formed of one selected between polyimide and epoxy.

The method may further include forming a barrier layer on the semiconductor substrate on which the buffer insulation layer is formed, where the barrier layer is formed of one selected between titanium (Ti) and titanium tungsten (TiW).

The seed layer may be formed of copper. The pillars formed by performing the primary electroplating process may be formed of copper. The height of the pillars formed by the primary electroplating process may be from 10% to 70% of the overall height of bumps.

The method may further include removing a natural oxide layer formed on a surface of the semiconductor substrate after the photoresist pattern is removed and before a reflow process is performed. The natural oxide layer on a surface of the semiconductor substrate may be removed by putting the semiconductor substrate in a chamber and performing thermal treatment thereon in a formic acid ($HCO_2H$) atmosphere. The thermal treatment may be performed at a temperature from 200° C. to 250° C.

The method may further include a cleaning process using distilled water.

The portions of the seed layer formed in regions other than the solder bumps may be removed by wet-etching the same. The wet-etching may be performed using hydrogen peroxide ($H_2O_2$).

Exemplary embodiments of the present inventive concept also provide a method of forming bumps of a semiconductor device with reduced solder bump collapse, the method including forming a first bump structure formed of conductive pillars connected to pads and a solder layer; removing a natural oxide layer by performing thermal treatment on a semiconductor substrate, in which the first bump structure is formed, by using formic acid ($HCO_2H$); forming a second bump structure by performing a reflow process on the first bump structure; and performing an etching process to remove a seed layer formed at the bottom of first conductive pillars in the second bump structure.

Exemplary embodiments of the present inventive concept also provide a method of forming bumps of a semiconductor device, the method comprising: forming a seed layer over a semiconductor substrate having contact pads thereon; etching select portions of the seed layer to expose the pads; forming pillars over the pads by a primary electroplating process; forming a solder layer by a secondary electroplating process on the pillars; forming solder bumps by a reflow process on the solder layer such that solder partially covers the surface of the pillars; and removing portions of the seed layer where the solder bumps are not formed.

In an embodiment, the method further includes forming a mask over the seed layer except over the pads such that the etching of the seed layer exposes the pads, the mask providing for the pillars to be formed only at regions over the pads; and removing the mask layer after forming the solder layer.

In an embodiment, the method further includes forming a buffer insulation layer over the substrate while exposing the pads before forming the seed layer; and forming a barrier layer over the buffer insulation layer and pads.

In an embodiment, the mask is formed of a photoresist pattern.

In an embodiment, the method further includes performing a thermal treatment on the top surface of the semiconductor substrate to remove a natural oxide layer therefrom after removing the photoresist pattern.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE PREFERRED EMBODIMENTS

Figure 1:
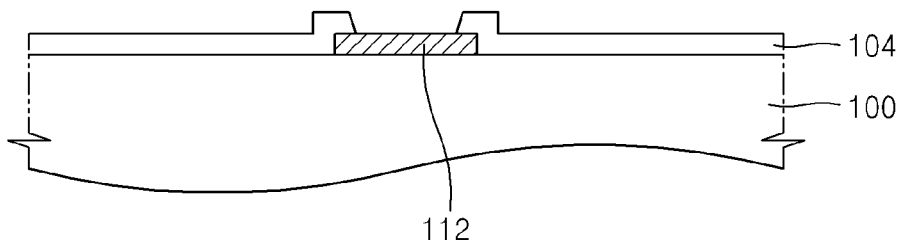
FIGS. 1 through 9 are sectional views describing a method of forming bumps of a semiconductor device with reduced solder bump collapse.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. In the drawings, the thicknesses of layers and regions are exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present inventive concept will be described in detail by explaining preferred embodiments of the present inventive concept with reference to the attached drawings. Like reference numerals in the drawings denote like elements.

FIGS. 1 through 9 are sectional views describing a method of forming bumps of a semiconductor device with reduced solder bump collapse.

Referring to FIG. 1, a semiconductor substrate 100, on which a pad 112 to extend electrical connections of a circuit integrated in a semiconductor device to an external electronic device is formed, is prepared. The semiconductor substrate 100 may be a wafer substrate in which a plurality of semiconductor chips are formed in a matrix form and are separated from each other by scribe lines (not shown). Furthermore, in the semiconductor substrate 100, a circuit unit may be formed in a silicon substrate via a wafer fabricating process, and the pad 112 may be exposed to the outside from a passivation layer 104.

A method of forming bumps of a semiconductor device with reduced solder bump collapse results may be applied to the semiconductor substrate 100 having any of various functions as long as the semiconductor substrate 100 has a structure in which bumps may be formed on the pads 112. For example, the semiconductor substrate 100 may be any of various devices, e.g., a DRAM device, a flash memory device, a system LSI device such as a microcontroller, an analog device, a digital signal processor device, a system on chip device, or a passive component.

Furthermore, the semiconductor substrate 100 may have a structure in which two or more wafers are stacked and the pads 112 are vertically connected to each other via through-silicon via (TSV).

Figure 2:
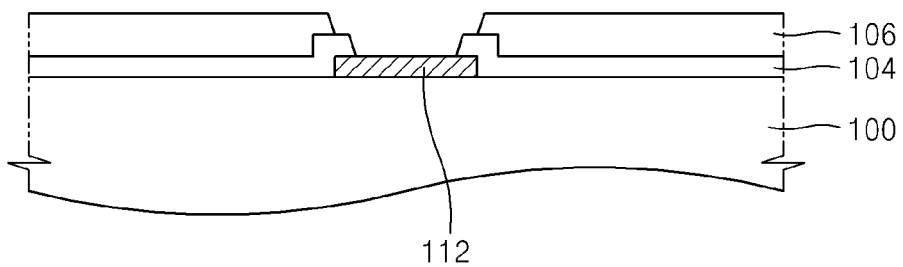

Referring to FIG. 2, a buffering insulation layer 106 is deposited to a predetermined thickness on the top surface of the semiconductor substrate 100 having the pads 112 exposed externally. A photoresist pattern (not shown) to expose the pads 112 is then formed on the buffering insulation layer 106, and the pads 112 are exposed externally by partially etching the buffering insulation layer 106 by using the photoresist pattern. The buffering insulation layer 106 may be formed of any of various insulation materials. In the present embodiment, the buffering insulation layer 106 may be formed of polyimide or an epoxy resin.

Figure 3:
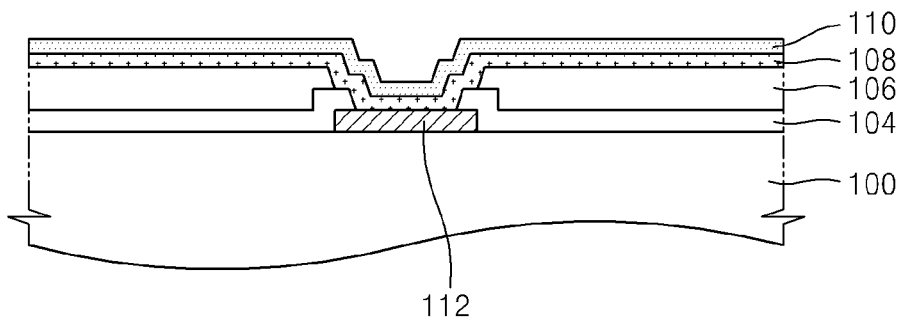

Referring to FIG. 3, a barrier layer 108 is formed on the top surface of the semiconductor substrate 100 on which the buffering insulation layer 106 exposing the pads 112 is formed. The barrier layer 108 may be formed of any material including titanium (Ti) or titanium tungsten (TiW) and may be formed to have a thickness from about 500 Å to about 4000 Å. The barrier layer 108 may be formed by using a metal layer deposition method, such as sputtering or physical vapor deposition (PVD), or may be formed by using any of various other metal layer deposition methods, if required. The barrier layer 108 may function as an adhesive layer between a metal layer deposited thereon, e.g., a seed layer 110, and the pads 112.

The seed layer 100 is then formed on the top surface of the semiconductor substrate 100, on which the barrier layer 108 is formed, to have a thickness from about 1000 Å to about 4000 Å. The seed layer 110 may be formed by any of various methods, such as sputtering, PVD, etc.

Figure 4:
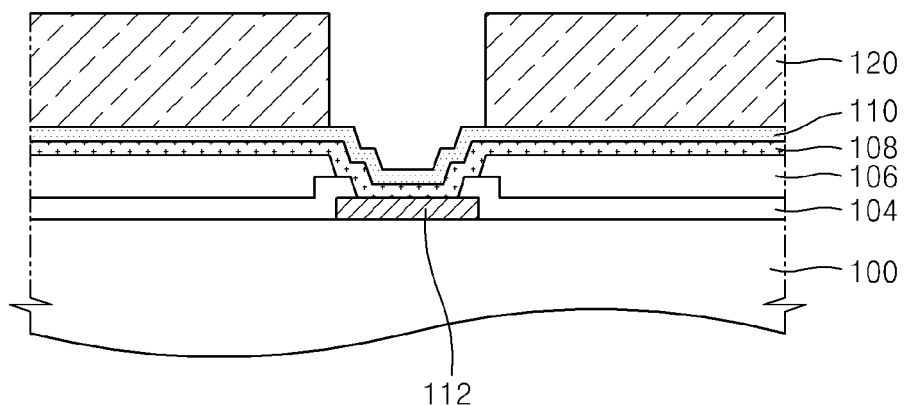
Figure 5:
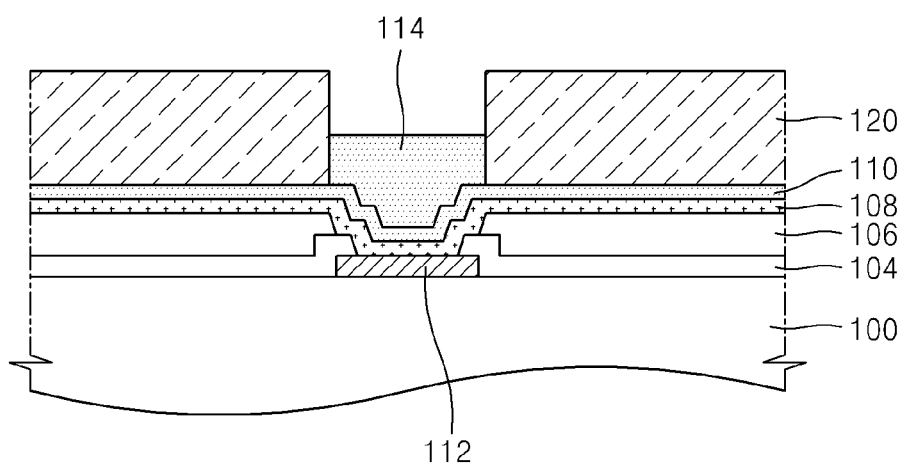

Referring to FIGS. 4 and 5, a photoresist pattern 120 is formed on the top surface of the semiconductor substrate 100 on which the seed layer 110 is formed. The photoresist pattern 120 may have a shape by which the seed layer 110 formed on the pads 112 may be exposed externally, and the thickness of the photoresist pattern 120 may be less than the overall height of bumps to be formed. The semiconductor substrate 100 on which the photoresist pattern 120 is formed is then put in a bath for electroplating, where a primary electroplating is performed by growing on the exposed seed layer. As a result, pillars, e.g. copper pillars 114, are formed. The copper pillars 114 are formed by using a pattern formed in a photolithography process, and thus, the copper pillars 114 may be formed with narrow gaps therebetween. Therefore, in a case where a large number of signals are input and output in a semiconductor device and it is necessary to form bumps with narrow gaps therebetween, the gaps between the bumps may be further narrowed by forming the bumps with pillars and solders instead of forming bumps with a solder layer only. The height of the copper pillars 114 may be from 10% to 70% of the overall height of the bumps, so that gaps between the bumps are narrowed.

Figure 6:
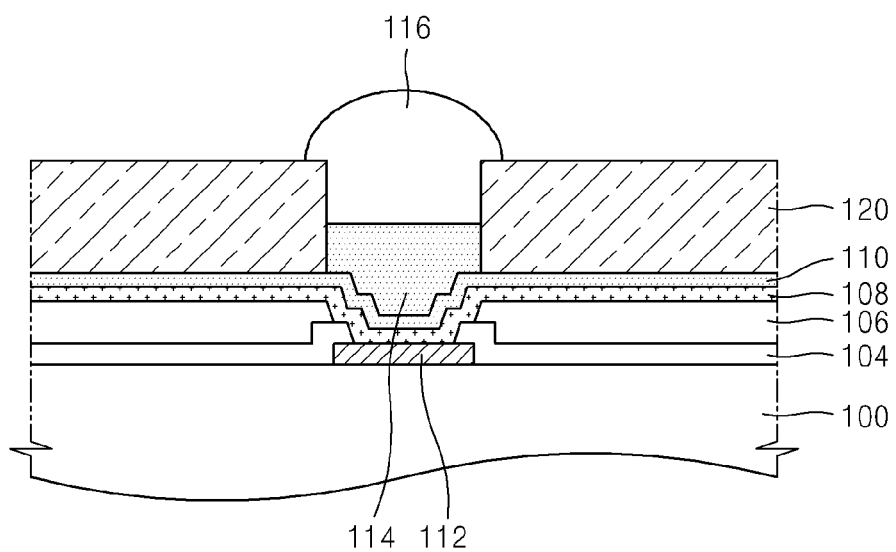
Figure 7:
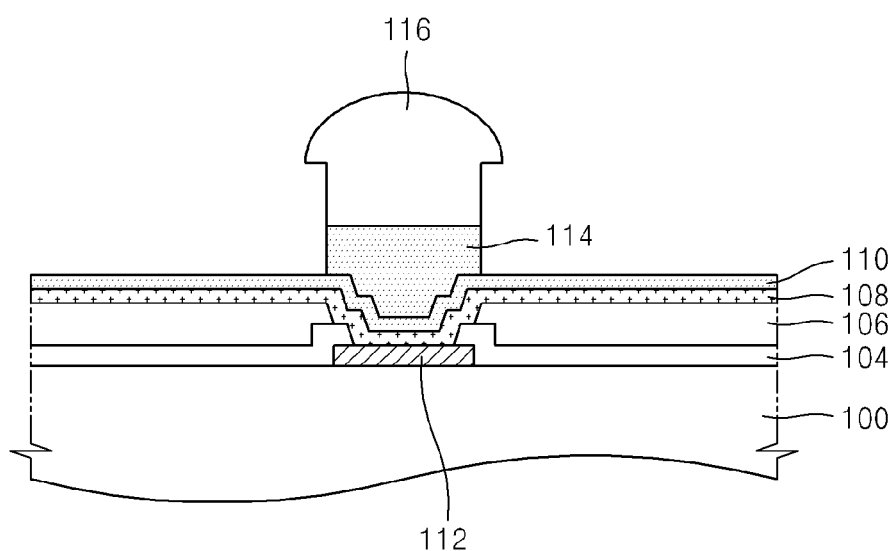

Referring to FIGS. 6 and 7, the semiconductor substrate 100 on which the copper pillars 114 are formed is put in another bath and a solder layer 116 is formed on the copper pillars 114 by performing a secondary electroplating. The solder layer 116 may be formed to have a greater or lesser height than the photoresist pattern 120, as desired. The solder layer 116 may be formed of an alloy of tin and silver (Sn/Ag Alloy), and copper (Cu), palladium (Pd), bismuth (Bi), antimony (Sb), etc. may be added thereto, if required. After the solder layer 116 is formed, the photoresist pattern 120 is then removed by performing an ashing process, as shown in FIG. 7.

Figure 8:
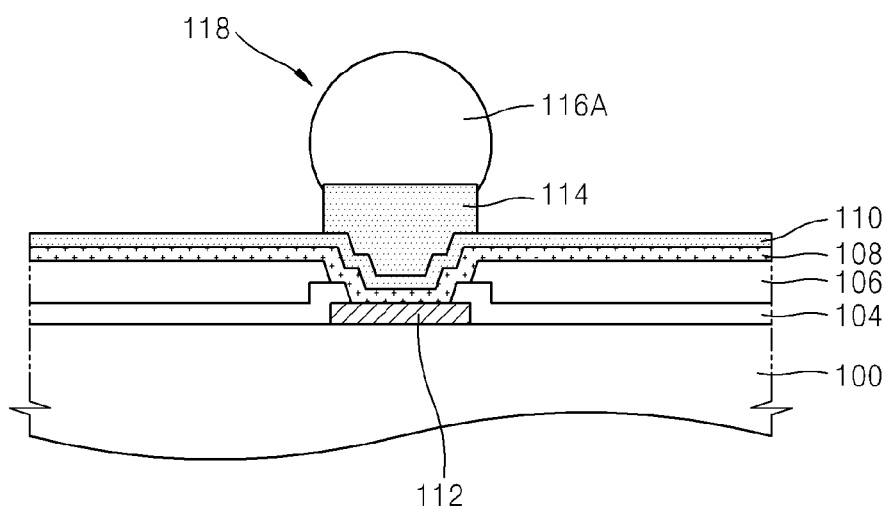

Referring to FIG. 8, after the photoresist pattern 120 is removed, a process to remove a natural oxide layer formed on the top surface of the semiconductor substrate 100 is performed. According to an embodiment of the inventive concept, a natural oxide layer formed on the top surface of the semiconductor substrate 100 is removed by performing a thermal treatment by using formic acid (HCO2H), which is a type of carboxylic acid. In detail, aerosol-state formic acid particles are finely and uniformly distributed in a chamber to remove a natural oxide layer, and a natural oxide layer is removed by performing thermal treatment at a temperature from about 200° C. to about 250° C.

In a bumping process, liquid flux is generally used to remove a natural oxide layer. Flux may remove natural oxide layers formed on surfaces of the copper pillars 114 and improves wettability of surfaces of the copper pillars 114, so that the solder layer 116 is easily melted to cover the surfaces of the copper pillars 114. However, in a case of using flux, flux residue may remain on the seed layer 110 formed of copper. Therefore, as in the inventive concept, if a reflow process is performed first and the seed layer 111 is removed in a subsequent process by performing wet-etching, a portion of the seed layer 111 in a region with flux residue may not be removed via wet-etching.

To resolve such a problem, a thermal treatment process using a forming acid is employed to remove a natural oxide layer in the inventive concept. Therefore, liquid flux is not applied onto the semiconductor substrate 100 and only aerosol-state formic acid contacts a surface of the semiconductor substrate 100. Therefore, it is not necessary to perform a separate cleaning process to remove flux. However, if required, a cleaning process to remove formic acid residue by using distilled water after a reflow process can be performed.

Generally, if a natural oxide layer is removed by performing a flux process before a reflow process is performed, it is necessary to use a flux cleaning agent, and thus, significant effort and cost are spent for maintaining an expensive cleaning agent in a state suitable to remove flux. However, such problems may be resolved by removing a natural oxide layer by performing a heat treatment process using a formic acid.

A reflow process is then performed on the semiconductor substrate 100 to which heat treatment is performed using a formic acid in a reflow equipment at a temperature from about 220° C. to about 260° C. Here, a solder layer 116A on bumps 118 is melted, flows downward, and covers the copper pillars 114, where an inter-metallic compound (IMC) (not shown) is formed between the solder layer 116A and the copper pillars 114.

Accordingly, because a reflow process is performed before an etching process to remove the seed layer 110 in the inventive concept, reduction of a diameter of the copper pillars 114 due to etching side surfaces of the copper pillars 114 of the bumps 118 may be prevented, and thus, a collapse defect, which refers to collapse of a solder layer in a direction, can be reduced as a result of the reflow process. A cleaning process using DI (de-ionized) water is then selectively performed to remove formic acid particles remaining on the semiconductor substrate 100.

Figure 9:
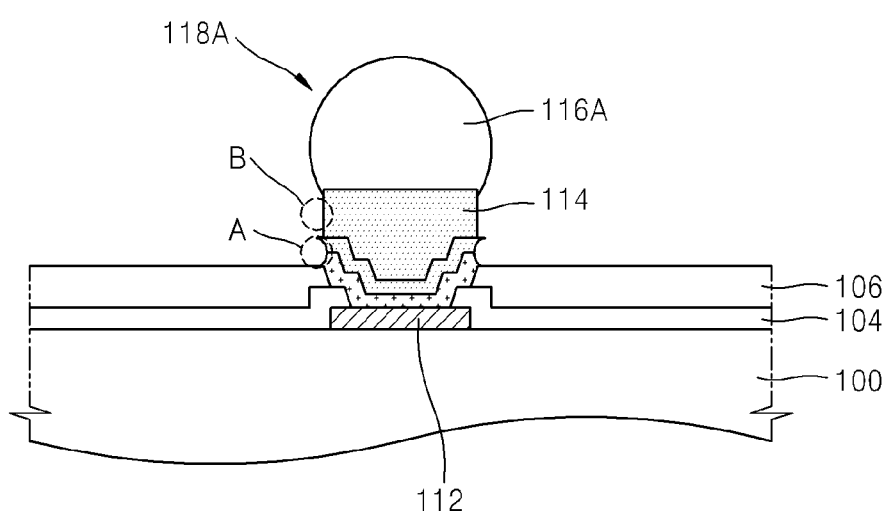

Referring to FIG. 9, although the seed layer 110 functions as a seed to grow the copper pillars 114 in an electroplating process, the seed layer 110 becomes an unnecessary conductive layer in regions other than the bumps 118 after the electroplating process is performed. Therefore, it is necessary to remove both the seed layer 110 and the barrier layer 108 by using suitable methods. According to embodiments of the inventive concept, the seed layer 110 and the barrier layer 108 are removed by wet-etching both layers by using hydrogen peroxide as an etchant. Because an etching process is performed after a reflow process is performed in the inventive concept, surfaces of the copper pillars 114 of the bumps 118 are covered with the solder layer 116A. Therefore, the side surfaces of the copper pillars 114 are not etched during the wet-etching operation, and thus, the diameters of the copper pillars 114 are not reduced. However, slight undercuts A may be formed at the barrier layer 108 and the seed layer 110 at the bottom of the bumps 118A. Because an etching process to remove a seed layer is performed after a reflow process is performed in the inventive concept, a step B is formed between the solder layer 116A and the copper pillars 114, and a portion not covered by the solder layer 116A is slightly etched.

Although the seed layer 110 and the barrier layer 108 are removed by performing wet-etching, this is merely an embodiment of the inventive concept, and the seed layer 110 and the barrier layer 108 may be removed by performing other types of etching, e.g., dry etching.

Figure 10:
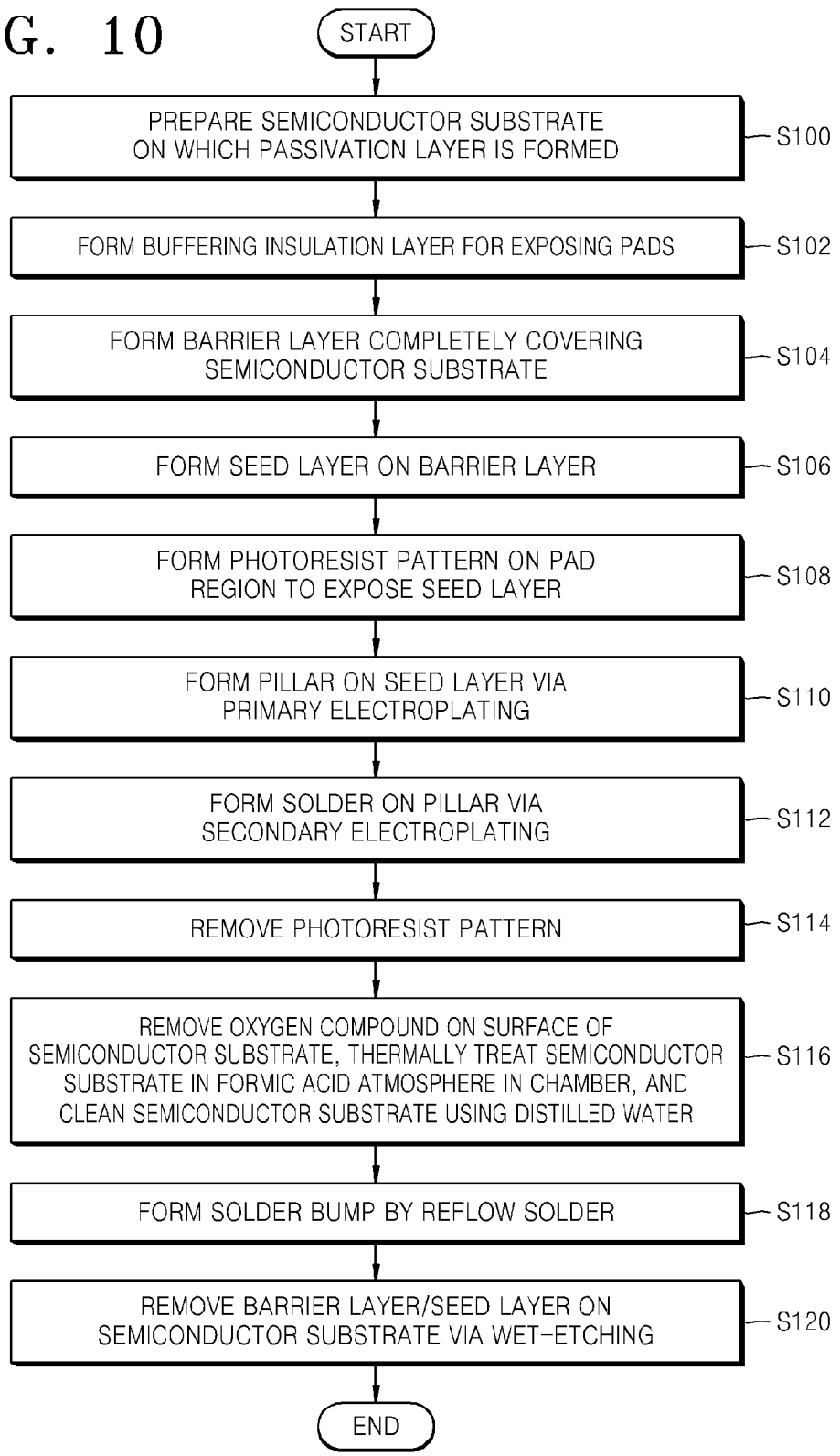
FIG. 10 is a flowchart describing a method of forming bumps of a semiconductor device with reduced solder bump collapse, according to an embodiment of the inventive concept.

FIG. 10 is a flowchart describing a method of forming bumps of a semiconductor device with reduced solder bump collapse, according to an embodiment of the inventive concept. For convenience of explanation, descriptions will be given below with reference also to FIGS. 1 through 9.

Referring to FIG. 10, a semiconductor substrate on which a passivation layer is formed is prepared (operation S100). A buffering insulation layer to expose pads of the semiconductor substrate is then formed as shown in FIG. 2 (operation S102). A barrier layer covering the entire semiconductor substrate is then formed by using titanium or titanium tungsten (operation S104), and a seed layer is formed on the barrier layer by using copper (operation S106).

A photoresist pattern to expose the seed layer on the pad region is then formed as shown in FIG. 4 (operation S108), and a primary electroplating process to form copper pillars by growing the seed layer as shown in FIG. 5 is performed (operation S110). A secondary electroplating process to form a solder layer on the copper pillars, as shown in FIG. 6, is then performed (operation S112), and the photoresist pattern used as an electroplating stopping layer is removed (operation S114).

Instead of removing a natural oxide layer on the semiconductor substrate by performing a flux process, a process to remove a natural oxide layer on the semiconductor substrate by performing a thermal treatment using a formic acid is then performed (operation S116). A reflow process is then performed as shown in FIG. 8 (operation S118), and thus a solder layer covers surfaces of the copper pillars without collapsing. Finally, the seed layer and the barrier layer formed on the semiconductor substrate are removed by wet-etching the same, as shown in FIG. 9 (operation S120).

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of forming bumps of a semiconductor device with reduced solder bump collapse, the method comprising:
   preparing a semiconductor substrate in which pads are exposed externally through a passivation layer;
   forming a seed layer on the semiconductor substrate;
   forming a photoresist pattern to expose a portion of the seed layer on the pads;
   forming pillars by performing a primary electroplating at a region exposed by the photoresist pattern;
   forming a solder layer by performing a secondary electroplating on the pillars, such that at least a portion of the solder layer directly contacts a top surface of the photoresist pattern;
   removing the photoresist pattern;
   performing a thermal treatment on the semiconductor substrate using formic acid (HCO2H) such that a natural oxide layer is removed;
   forming solder bumps, in which solder partially covers surfaces of the pillars, by performing a reflow process on the semiconductor substrate; and
   removing portions of the seed layer formed in regions other than the solder bumps after forming the solder bumps.

2. The method of claim 1, further comprising:
   forming a buffer insulation layer over the passivation layer to expose the pads on the semiconductor substrate.

3. The method of claim 1, wherein the buffer insulation layer is formed of one selected between polyimide and epoxy.

4. The method of claim 2, further comprising:
   forming a barrier layer on the semiconductor substrate on which the buffer insulation layer is formed.

5. The method of claim 4, wherein the barrier layer is formed of one selected between titanium (Ti) and titanium tungsten (TiW).

6. The method of claim 1, wherein the seed layer is formed of copper.

7. The method of claim 1, wherein the pillars formed by performing the primary electroplating process are formed of copper.

8. The method of claim 1, wherein the height of the pillars formed by the primary electroplating process is from 10% to 70% of the overall height of the bumps.

9. The method of claim 1, wherein the thermal treatment is performed at a temperature from 200° C. to 250° C.

10. The method of claim 1, further comprising:
    performing a cleaning process using distilled water after the reflow process.

11. The method of claim 1, wherein the portions of the seed layer formed in regions other than where the solder bumps are located are removed by wet-etching the same.

12. The method of claim 11, wherein the wet-etching is performed using hydrogen peroxide (H2O2).

13. A method of forming bumps of a semiconductor device, the method comprising:
    forming, on a semiconductor substrate having a photoresist pattern on a top surface thereof, a first bump structure from conductive pillars connected to pads and a solder layer on the pillars, such that at least a portion of the solder layer directly contacts a top surface of the photoresist pattern;
    performing a thermal treatment on the semiconductor substrate using formic acid (HCO2H) such that a natural oxide layer is removed;
    forming a second bump structure by performing a reflow process on the first bump structure; and
    performing an etching process to remove a seed layer formed at the bottom of first conductive pillars in the second bump structure.

14. A method of forming bumps of a semiconductor device, the method comprising:
    forming a buffering insulation layer over a semiconductor substrate having contact pads thereon;
    etching select portions of the buffering insulation layer to expose the pads;
    forming a seed layer over the semiconductor substrate and the pads;
    forming a photoresist pattern over the seed layer;
    forming pillars over the pads by a primary electroplating process;
    forming a solder layer by a secondary electroplating process on the pillars such that at least a portion of the solder layer directly contacts a top surface of the photoresist pattern;
    performing a thermal treatment on the semiconductor substrate using formic acid (HCO2H) such that a natural oxide layer is removed;
    forming solder bumps by a reflow process on the solder layer such that solder partially covers the surface of the pillars; and
    removing portions of the seed layer where the solder bumps are not formed after forming the solder bumps.

15. The method of claim 14, further comprising:
    forming the photoresist pattern over the buffering insulation layer except over the pads such that the etching of the seed layer exposes the pads, the photoresist pattern providing for the pillars to be formed only at regions over the pads; and
    removing the photoresist pattern after forming the solder layer.

16. The method of claim 15, further comprising:
    forming a barrier layer over the buffer insulation layer and pads.

17. The method of claim 14, wherein the reflow process comprises a heat treatment performed using a formic acid in a reflow equipment at a temperature from about 220° C. to about 260° C.

* * * * *